(12) United States Patent
Kawamura et al.

(10) Patent No.: US 7,405,035 B2
(45) Date of Patent: Jul. 29, 2008

(54) PATTERN FORMING METHOD AND SUBSTANCE ADHERENCE PATTERN MATERIAL

(75) Inventors: Koichi Kawamura, Shizuoka-ken (JP); Takeyoshi Kano, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 177 days.

(21) Appl. No.: 10/735,769

(22) Filed: Dec. 16, 2003

(65) Prior Publication Data

US 2004/0126712 A1 Jul. 1, 2004

(30) Foreign Application Priority Data

| Dec. 17, 2002 | (JP) | ............................. 2002-364984 |
| Feb. 28, 2003 | (JP) | ............................. 2003-053366 |
| Mar. 3, 2003 | (JP) | ............................. 2003-055919 |
| Dec. 11, 2003 | (JP) | ............................. 2003-412953 |

(51) Int. Cl.
*G03F 7/00* (2006.01)

(52) U.S. Cl. ..................... 430/322; 430/320; 430/324

(58) Field of Classification Search ................ None
See application file for complete search history.

(56) References Cited

U.S. PATENT DOCUMENTS 6,919,158 B2 * 7/2005 Kawamura et al. ........ 430/270.1

FOREIGN PATENT DOCUMENTS

EP 0 809 282 A1 11/1997

OTHER PUBLICATIONS

Yoshinobu Tsujii et al.: "Fabrication of patterned high-density polymer graft surfaces. II. Amplification of EB-patterned initiator monolayer by surface-initiated atom transfer radical polymerization", Polymer, Elsevier Science Publishers B.V, GB, vol. 43, No. 13, Jun. 2002, pp. 3837-3841, XP004349557.

Rahul R. Shah, et al., "Using atom transfer radical polymerization to amplify monolayers of initiators patterned by microcontact printing into polymer brushes for pattern transfer", MACROMOLECULES, vol. 33, No. 2, Aug. 1, 2000, pp. 597-605, XP002273494.

Krzysztof Matyjaszewski, et al., "Atom transfer radical polymerization", Chemical Reviews, American Chemical Society. Easton, US, vol. 101, No. 9, Dec. 9, 2001, pp. 2921-2990, XP002212148.

Younan Xia, et al., "Soft Lithography", Angewandte Chemie. International Edition, Verlag Chemie. Weinheim, DE, vol. 37, 1998, pp. 550-575, XP002149045.

* cited by examiner

*Primary Examiner*—John A. McPherson
*Assistant Examiner*—Daborah Chacko-Davis
(74) *Attorney, Agent, or Firm*—Sughrue Mion, PLLC

(57) ABSTRACT

The present invention relates to a pattern forming method comprising image-wise forming, on a surface of a substrate, a region having an ability to initiate polymerization, forming a graft polymer on the region by atom transfer radical polymerization, and adhering a substance to the graft polymer. The method can be applied for preparing an image forming material, a fine particle adsorption pattern material, a conductive pattern material, or the like by selecting a suitable substance.

13 Claims, 1 Drawing Sheet

PATTERN FORMING METHOD AND SUBSTANCE ADHERENCE PATTERN MATERIAL

CROSS-REFERENCE TO RELATED APPLICATION

This application claims priority under 35 USC 119 from Japanese patent Application Nos. 2002-364984, 2003-53366, 2003-55919 and 2003-412953, the disclosures of which are incorporated by reference herein.

BACKGROUND OF THE INVENTION

1. Field of the Invention

The present invention relates to a pattern forming method and in particular to a pattern forming material capable of forming a pattern which has excellent resolution, and a substance adherence pattern material obtained by using said pattern forming material.

2. Description of the Related Art

An image forming method that utilizes a method of forming a hydrophilic/hydrophobic pattern has been widely used. In particular, an image forming method comprising adhering a colorant to a region has been widely used.

For example, an image forming method is employed in which a hydrophilic/hydrophobic pattern is on the surface of an image-receiving material, then an image is formed by utilizing a difference in adsorptivity of a hydrophilic or hydrophobic surface toward a visualizing material. Further, various methods of forming a hydrophilic/hydrophobic pattern are employed to form a display material, a planographic printing plate material and a semiconductor integrated circuit material.

Particularly from the viewpoint of particularly improving the resolution of a formed image, a method of forming a fine hydrophilic/hydrophobic pattern is attracting attention. As the method of forming a hydrophilic/hydrophobic pattern, there is disclosed a method in which a surface of a plate which surface has a convex pattern adsorbs a hydrophobic molecule, the hydrophobic molecule is transferred to an image-receiving material, and then a hydrophilic molecule is adsorbed by non-transferred regions on the image-receiving material, whereby a hydrophilic/hydrophobic pattern is formed on the image-receiving surface. This method is useful for production of various functional devices and DNA chips (see, for example, Japanese Patent Application Laid-Open (JP-A) No. 2002-283530). This method of forming a hydrophilic/hydrophobic pattern can be used to form a precise pattern. However, in order to obtain such a precise pattern, a special material is required and further, it is difficult to apply the method of forming a hydrophilic/hydrophobic pattern to formation of an image with a large area.

Regarding application to formation of an image with a large area, there is known a planographic printing plate material. When the planographic printing plate material is used, a hydrophilic graft polymer is formed on the entire area of a hydrophobic substrate, and the hydrophilic graft polymer is image-wise released from the surface of the substrate by exposure to laser light to form a hydrophilic/hydrophobic pattern comprising the hydrophilic graft polymer and the hydrophobic surface of the substrate, then an ink and water are allowed to adhere thereto based on the pattern (for example, JP-A No. 11-119413). According to this method, a hydrophilic/hydrophobic pattern with a large area can be formed. However, because high energy is required for releasing the hydrophilic graft polymer, an expensive high-power laser is required to form an image. Moreover, the qualities and resolution of the formed image are not satisfactory.

Another application of the hydrophilic/hydrophobic pattern is a technique for arranging fine particles in pattern.

Techniques of arranging fine particles are techniques important for achieving higher functions such as larger area, higher resolution and higher density of materials for catalysts, recording materials, sensors, electronic devices and optical devices. Such techniques are extensively studied.

For example, a method of forming aggregated fine particles is proposed in which a liquid dispersing medium containing fine particles is developed on a substrate to form a liquid thin coating thereon, the thickness of the liquid dispersing medium is decreased to a thickness equal to or thinner than the particle diameter, and the fine particles are aggregated by surface tension (see, for example, Japanese Patent No. 2828374). According to the invention described in Japanese Patent No. 2828374, a layer of fine particles can be regularly aggregated and uniformly arranged. However, it is difficult by the invention described in Japanese Patent No. 2828374 to obtain a patterned arrangement of the fine particles in a desired region.

As a technique for arranging fine particles according to a pattern, there is described a method in which the surface of an oxide substrate such as $TiO_2$ is irradiated with patterned light to prepare a hydrophilic/hydrophobic pattern on the surface, and fine particles are arranged based on the pattern (see, for example, JP-A No. 2002-273209). According to this method, a pattern of fine particles can be formed. However, since the fine particles are merely physically adsorbed without fixation and easily released, the pattern of fine particles is unsuitable for use in various devices. Further, the fine particles tend to adhere to a region other than the particle-adhering pattern, and there is a demand for a method of forming a pattern highly selectively to prevent the particles from adhering to a region other than the pattern.

As another technique of arranging fine particles according to a pattern, a method of laminating fine particles according to a pattern by using a micro-stamp is known as shown by G. M. Whitesides et al. (E. Kim, Y. Xia, G. M. Whitesides, Advanced Materials, vol. 8, p. 245, Wiley Interscience, 1996). According to this method, fine polymer particles of submicron size can be accumulated in order without adhering to other region than the pattern, thus a pattern can be obtained highly selectively. However, in this method, the procedure is difficult and the rate of solvent evaporation should be controlled in order to prepare an ordered laminate of particles, therefore the particle laminate cannot be easily produced. Further, since the area of the producible laminate is small, this method is unsuitable for producing a laminate with larger area. Also in this method, the adsorption strength of the fine particles laminated according to a pattern to a substrate is weak. Therefore, higher adsorption strength of the fine particles to the substrate is required from a practical point of view.

Another application of the hydrophilic/hydrophobic pattern is a technique regarding a conductive material. Conventionally, various conductive pattern materials have been used for formation of circuit boards (see, for example, Ei Kazuta, *Purinto Haisennbann No Seizougijutsu* (Techniques of Manufacturing Printed Circuit Boards) (CMC Publishing Co., Ltd., 2001). Typically, such conductive pattern materials are obtained by providing, on an insulating material, a thin conductive material by a known method such as vapor deposition, by treating it with a resist, by removing a part of the prepared resist by exposure to patterned light, and by etching the material to form a desired pattern. However, such methods require at least 4 steps. Moreover, when wet etching treatment is carried out, a step for disposal of waste solution is also required. Hence, the process has to be complicated. As another method of forming a pattern, a method of forming a conductive pattern material by using a photoresist is also known. This method involves applying a photoresist polymer onto a substrate or sticking a photoresist on a dry film to a substrate and then exposing the substrate via an arbitrary photomask to UV rays to form a checked pattern or the like. This method is useful for formation of an electromagnetic wave shield which requires high electrical conductivity.

As micromachines are further developed and ultra-LSI is further downsized, a finer wiring structure is also required to nano-degree. However, there is a limitation of finer processing by metal etching, and the breaking of fine wires during processing is worried about. Accordingly, a method has been desired by which a precise pattern with regulated orientation can be formed.

Meanwhile, regarding a conductive material, a method has been paid attention to in recent years in which a pattern is formed directly from digitalized data without a mask. Various proposals regarding the method have been made (see, for example, JP-A No. 2002-324966).

By utilizing such methods of forming a digitalized pattern, arbitrary formation of fine patterns can be expected. One of these methods is a method of using a self-organizing monomolecular film. This method utilizes a molecular aggregate formed spontaneously when a substrate is dipped in an organic solvent containing surfactant molecules. For example, a combination of an organosilane compound and a $SiO_2$ or $Al_2O_3$ substrate or a combination of an alcohol or an amine and a platinum substrate can be used to form a pattern by light lithography or the like. Such a monomolecular film enables formation of a fine pattern. However, since the substrate/material combination usable in the monomolecular film is limited, it is difficult to put the method to practical use. The technique of forming a fine wire pattern which can be practically employed has not yet been established.

From the viewpoint of lightweight, flexibility and environmental compatibility, an organic transistor using a conductive polymer pattern has been studied. A support using such organic material is characterized by that the support is light, thin, and flexible and that an element with a large area can be easily (by the same printing technique as in printing at room temperature) prepared by using such support. By combining these characteristics with electrical and optical characteristics of new organic semiconductor which is being developed, new development can be expected in techniques for personalization of information which is most strongly demanded in the present information technology. Such technique is, for example, techniques of producing wearable portable terminals having simple information processing functions and easily manipulatable input/output functions.

However, any of these techniques do not satisfy demands from practical viewpoints such as durability, stability of conductivity, applicability to larger area, and manufacturing suitability.

SUMMARY OF THE INVENTION

It is an object of the invention to solve the problems in the prior art, and to achieve the following objects.

That is, one object of the invention is to provide a pattern forming method which, upon application of energy, can easily give a pattern having uniform quality, sharpness, and function according to a substance adhered to the pattern. This pattern forming method can be applied to a planographic printing plate utilizing characteristics of hydrophilic/hydrophobic regions, a diffraction grating, a polarizer, an antireflection coating, a microlens, and a diffuser, each of which utilizes selective adherence of substance to a pattern.

Another object of the invention is to provide an image forming method which can be employed in wide range of applications such as a display material and a planographic printing plate utilizing high hydrophilicity of a hydrophilic graft polymer, wherein an image obtained by the image forming method can, upon application of energy, easily give an image having uniform quality, sharpness, and high density regardless of the area thereof.

Another object of the invention is to provide a fine particle adsorption pattern forming method which is capable of easily forming, on only a desired region of a substrate, a strong and uniform pattern of adsorbed fine particles not releasable by mechanical operation such as rubbing and which is applicable to formation of a pattern with a large area, as well as to provide a fine particle adsorption pattern material produced by using the same.

Another object of the invention is to provide a conductive pattern forming method capable of easily forming fine wires (circuit) excellent in durability and conductive stability, free of wire-breaking and having uniform thickness, as well as to provide a conductive pattern material produced by using the same.

Still another object of the invention is to provide a substance adherence pattern material in which a selected substance adheres to a sharp pattern strongly and selectively, the substance adherence pattern material having a function in accordance with the substance which adheres to the pattern. The substance adherence pattern material can be applied to wide range of uses. By selecting the substance, an image forming material, a fine particle adsorption pattern material, a conductive pattern material, or the like can be provided.

The objects can be achieved by the following means:

As a result of extensive study, the inventors found that a hydrophilic/hydrophobic pattern can be formed by fixing a hydrophilic or hydrophobic polymerization initiator to the surface of a substrate, allowing the initiator to cause graft polymerization of a monomer having the hydrophilicity/hydrophobicity opposite to the initiator by using an atom transfer radical polymerization method. The inventors also found that the hydrophilic/hydrophobic pattern can be used to give a pattern material by adhering a substance to the pattern, the pattern material having a function in accordance with the selection of the substance. That is, the pattern forming method according to the invention comprises: image-wise forming a region having an ability to initiate polymerization on the surface of a substrate; forming a graft polymer on the region by atom transfer radical polymerization to form a hydrophilic/hydrophobic pattern corresponding to regions having the graft polymer formed and not formed; and allowing a material to adhere to the hydrophilic or hydrophobic region of the hydrophilic/hydrophobic pattern.

When a hydrophilic/hydrophobic pattern is formed by the pattern forming method of the invention, it is important that the hydrophilicity/hydrophobicity of a polymerization initiator (also referred to as initiator) fixed on a substrate should be opposite to that of a monomer; that is, when a hydrophilic initiator is used, a hydrophobic monomer should be used, and when a hydrophobic initiator is used, a hydrophilic monomer should be used. From the viewpoint of image formability, it is usually preferable that a hydrophobic initiator is combined with a hydrophilic monomer to form a hydrophilic graft polymer region.

The mechanism of the invention is not evident at present, but it is estimated that because the atom transfer radical polymerization method is used in the pattern forming method of the invention during formation of a graft polymer having an ability to adsorb a substance, the resulting graft polymers have a low degree of dispersion with very narrow molecular-weight distribution. And since such graft polymers are formed in accordance with the image-like pattern on the fixed initiator and a polymer film pattern having uniform thickness is formed, the hydrophilic/hydrophobic pattern thus prepared can be used in substance adherence pattern formation to provide a substance adherence pattern having uniform qualities and high sharpness.

In a preferable embodiment where a hydrophilic graft polymer region is formed by combining a hydrophobic initiator with a hydrophilic monomer and a colorant is adsorbed by the hydrophilic graft polymer, the hydrophilic graft polymer is more preferable than a hydrophobic graft polymer from the viewpoint of image formability since the hydrophilic graft polymer has polar functional groups, which is suitable to interaction with the colorant.

When a colorant is used as the substance, an image forming method is provided. The image forming method according to the invention comprises: image-wise forming a region having an ability to initiate polymerization on the surface of a substrate; forming a graft polymer on the region by atom transfer radical polymerization to form a hydrophilic/hydrophobic pattern corresponding to regions having the graft polymer formed and not formed; and allowing a colorant to adhere to the hydrophilic or hydrophobic region of the hydrophilic/hydrophobic pattern.

When a fine particle is selected as the substance, a fine particle adsorption pattern forming method is provided. The fine particle adsorption pattern forming method according to the invention comprises: image-wise forming a region having an ability to initiate polymerization on the surface of a substrate; forming a graft polymer on the region by atom transfer radical polymerization; and allowing the graft polymer to adsorb fine particles.

The fine particle adsorption pattern material according to the invention is prepared by image-wise forming a region having an ability to initiate polymerization on the surface of a substrate, forming a graft polymer on the region by atom transfer radical polymerization, and allowing the graft polymer to adsorb fine particles.

When a conductive substance is selected as the substance, a conductive pattern forming method is provided. The conductive pattern forming method according to the invention comprises: image-wise forming a region having an ability to initiate polymerization on the surface of a substrate; forming a graft polymer on the region by atom transfer radical polymerization; and allowing the graft polymer to adsorb a conductive material.

The conductive pattern material of the invention is prepared by image-wise forming a region having an ability to initiate polymerization on the surface of a substrate, forming a graft polymer on the region by atom transfer radical polymerization, and allowing the graft polymer to adsorb a conductive material.

The graft polymer in the fine particle adsorption pattern forming method and the conductive pattern forming method according to the invention is produced by atom transfer radical polymerization. Preferably the graft polymer has a polar group, and more preferably the graft polymer has a polar group on its side chain. The polar group is particularly preferably an ionic group that can dissociate into ions.

The graft polymer is fixed very strongly to the substrate since one of terminals thereof is bound chemically to a substrate. However, since only one of the terminals of the graft polymer is fixed to the substrate, the graft polymer is highly movable with very low restrictions on the motion thereof. In the fine particle adsorption pattern forming method according to the invention, the above-described basic property of the graft polymer and the strong interaction exhibited by polar groups in the graft polymer can provide a physically strong (highly durable) laminate film of fine particles when fine particles are adsorbed by the graft polymer. In the conductive pattern forming method according to the invention, the above-described basic property of the graft polymer and the strong interaction exhibited by polar groups in the graft polymer can provide a physically strong (highly durable) conductive pattern when a conductive material is adsorbed by the graft polymer thereby forming. The mechanism for such action is not evident. However, it is estimated that polar groups in the graft polymers coordinate effectively around the fine particles or the conductive material to achieve more efficient interaction due to the strong interaction between polar groups in the graft polymer and polar groups in fine particles or between polar groups in the graft polymer and polar groups in a conductive material, and the free movement of the graft polymers.

In the fine particle adsorption pattern forming method according to the invention, when graft polymers are formed on a patterned region and fine particles are laminated based on the pattern, since the adsorption strength of the fine particles to the patterned region is extremely stronger than to the non-pattern region, a small amount of fine particles adsorbed onto a region outside of the desired range can be completely removed. As a result, a highly selective pattern of adsorbed fine particles can be formed.

However, in the fine particle adsorption pattern material and the fine particle adsorption pattern forming method according to the invention, it is imperative to note that the interaction between the graft polymer and the fine particle may also be a hydrophobic interaction.

In the invention, when graft polymers are formed on a patterned (image-wise) region and a conductive material is adsorbed based on the pattern, since the adsorption strength of the conductive material to the patterned region is extremely stronger than to the non-pattern region, a small amount of the conductive material adsorbed onto a region outside of the desired range can be completely removed. As a result, fine wiring (circuit) having uniform thickness can be selectively formed without wire-breaking.

DETAILED DESCRIPTION OF THE INVENTION

Figure 1:
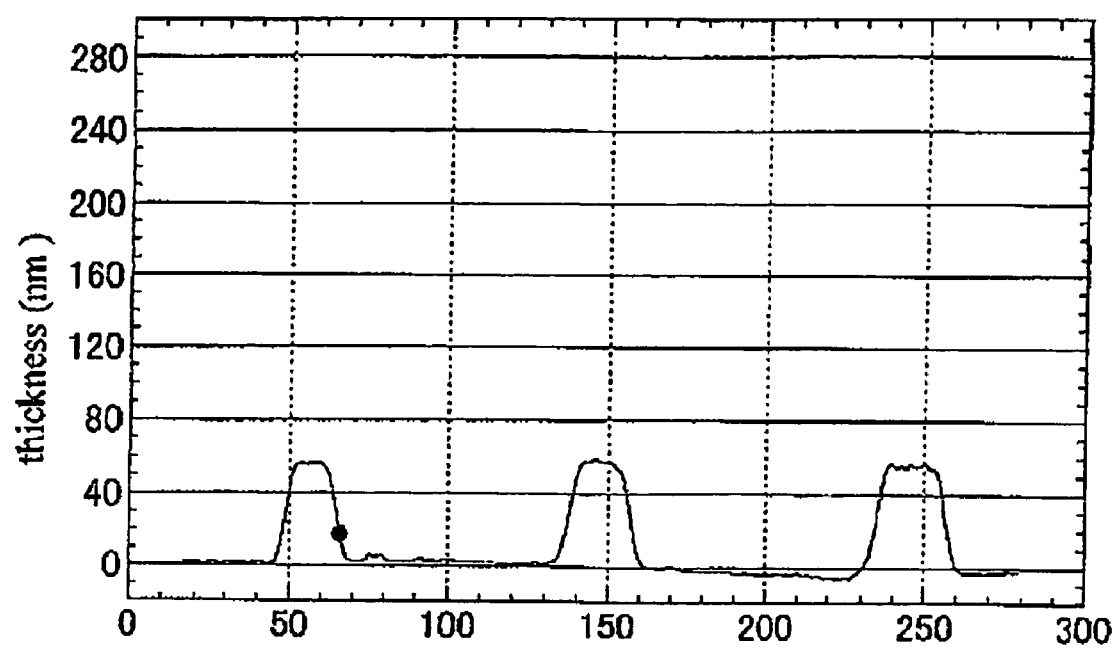
FIG. 1 is a graph showing the thickness of a section, in the height direction, of a silicon substrate measured with AFM.

Hereinafter, the present invention is described in more detail.

One embodiment of the invention is a pattern forming method (M), comprising image-wise forming, on a surface of a substrate, a region having an ability to initiate polymerization, forming a graft polymer on the region by atom transfer radical polymerization to form a hydrophilic/hydrophobic pattern which includes regions having a graft polymer formed and regions having no graft polymer formed, and applying a substance to the hydrophilic or hydrophobic region of the hydrophilic/hydrophobic pattern.

Another embodiment of the invention is the pattern forming method (M), wherein the region having an ability to initiate polymerization is formed by fixing a polymerization initiator thereon and the graft polymer contains a monomer having hydrophilicity/hydrophobicity opposite to the hydrophilicity/hydrophobicity of the polymerization initiator.

Another embodiment of the invention is the pattern forming method (M), wherein the substance is a colorant.

Another embodiment of the invention is the pattern forming method (M), wherein the substance is a colorant and the graft polymer contains a monomer having hydrophilicity/hydrophobicity opposite to the hydrophilicity/hydrophobicity of the polymerization initiator.

Another embodiment of the invention is the pattern forming method (M), wherein the substance is a dye.

Another embodiment of the invention is the pattern forming method (M), wherein the substance is a dye and the dye has a charge opposite to a charge of the graft polymer.

Another embodiment of the invention is the pattern forming method (M), wherein the substance is fine particles.

Another embodiment of the invention is the pattern forming method (M), wherein the substance is fine particles and the graft polymer has a polar group.

Another embodiment of the invention is the pattern forming method (M), wherein the substance is fine particles and the fine particles each have a charge opposite to a charge of the graft polymer.

Another embodiment of the invention is the pattern forming method (M), wherein the substance is a conductive material.

Another embodiment of the invention is the pattern forming method (M), wherein the substance is a conductive material and the graft polymer has a polar group.

Another embodiment of the invention is the pattern forming method (M), wherein the substance is a conductive material and the conductive material is fine conductive particles each having a charge opposite to that of the graft polymer.

Another embodiment of the invention is the pattern forming method (M), wherein the substance is a conductive material and the conductive material is a conductive polymer comprising a conductive monomer which can be adsorbed by a functional group of the graft polymer through ionic force.

Another embodiment is a substance adherence pattern material (N) prepared by image-wise forming, on a surface of a substrate, a region having an ability to initiate polymerization, by forming a graft polymer on the region by atom transfer radical polymerization, and by applying a substance to the graft polymer.

Another embodiment of the invention is the substance adherence pattern material (N), wherein the region having an ability to initiate polymerization is formed by fixing a polymerization initiator thereon and the graft polymer contains a monomer having hydrophilicity/hydrophobicity opposite to the hydrophilicity/hydrophobicity of the polymerization initiator.

Another embodiment of the invention is the substance adherence pattern material (N), wherein the substance is a colorant.

Another embodiment of the invention is the substance adherence pattern material (N), wherein the substance is fine particles.

Another embodiment of the invention is the substance adherence pattern material (N), wherein the substance is fine particles and the graft polymer has a polar group.

Another embodiment of the invention is the substance adherence pattern material (N), wherein the substance is fine particles and the fine particles each have a charge opposite to that of the graft polymer.

Another embodiment of the invention is the substance adherence pattern material (N), wherein the substance is a conductive material.

Another embodiment of the invention is the substance adherence pattern material (N), wherein the substance is a conductive material and the graft polymer has a polar group.

Another embodiment of the invention is the substance adherence pattern material (N), wherein the substance is a conductive material and the conductive material is fine conductive particles having a charge opposite to that of the graft polymer.

Still another embodiment of the invention is the substance adherence pattern material (N), wherein the substance is a conductive material and the conductive material is a conductive polymer comprising a conductive monomer which can be adsorbed by a functional group of the graft polymer through ionic force.

The term "hydrophilic" or "hydrophobic" used herein generally refers to an affinity to water. A property of having a high affinity to water is expressed as "hydrophilic." A property of having a low affinity to water and a high affinity to oil is expressed as "hydrophobic." From the viewpoint of a molecular structure, a compound having a functional group which can form a hydrogen bond with a hydroxyl group of water is generally hydrophilic. Such a functional group may be, for example, a hydroxyl group, an amino group, a carboxyl group, a sulfonic acid group, an amide group, or a carbonyl group. A compound having a polar group, which can interact with a polarized structure of water, is also likely to be hydrophilic. Such a compound having a polar group may be a compound having a structure which contains a positive charge or a negative charge. Examples of the structure which contains a positive charge include onium bases such as ammonium base and sulfonium base. Examples of the structure which contains a negative charge include a carboxylate group and a sulfonate group. Examples of hydrophobic functional group include alkyl groups such as a methyl group and an ethyl group, alicyclic groups such as a cyclohexyl group and an adamantyl group, and aromatic groups such as a phenyl group and a naphthyl group.

[Pattern Forming Method]

The pattern forming method according to the invention requires at least 3 steps, that is, the step (a) of image-wise fixing a polymerization initiator on the surface of a substrate, the step (b) of forming a graft polymer from the polymerization initiator by atom transfer radical polymerization to form a hydrophilic/hydrophobic pattern comprising regions having a graft polymer formed and not formed, and the step (c) of adhering a substance to the hydrophilic or hydrophobic region of the hydrophilic/hydrophobic pattern. The substance adherence pattern material according to the invention is prepared by the pattern forming method.

[Image Forming Method]

The image forming method according to the invention requires at least 3 steps, that is, the step (a) of image-wise fixing a polymerization initiator on the surface of a substrate, the step (b) of forming a graft polymer from the polymerization initiator by atom transfer radical polymerization to form a hydrophilic/hydrophobic pattern comprising regions having a graft polymer formed and not formed, and the step (c1) of allowing a colorant to adhere to the hydrophilic or hydrophobic region of the hydrophilic/hydrophobic pattern.

[Fine Particle Adsorption Pattern Forming Method]

The fine particle adsorption pattern forming method according to the invention comprises at least 3 steps, that is, the step (a) of image-wise forming a region having an ability to initiate polymerization on the surface of a substrate, the step (b) of forming a graft polymer by atom transfer radical polymerization on the region having an ability to initiate polymerization, and the step (c2) of allowing the graft polymer to adsorb fine particles.

[Conductive Pattern Forming Method]

The conductive pattern forming method according to the invention comprises at least 3 steps, that is, the step (a) of image-wise forming a region having an ability to initiate polymerization on the surface of a substrate, the step (b) of forming a graft polymer by atom transfer radical polymerization on the region having an ability to initiate polymerization, and the step (c3) of allowing the graft polymer to adsorb a conductive material.

Hereinafter, these steps are described.

[The Step (a) of Image-wise Forming Region Having Ability to Initiate Polymerization on Surface of Substrate]

This step is common among the image forming method, the fine particle adsorption pattern forming method and the conductive pattern forming method according to the invention. Methods employed in the "step of image-wise forming a region having an ability to initiate polymerization on the surface of a substrate" is not particularly limited, and may be any methods known from publications. In the invention, the "region having an ability to initiate polymerization" means "a region where an initiator having an ability to initiate polymerization is image-wise fixed", and refers not only literally to "a region having an initiator which is image-wise fixed on a substrate" but also to "a region where an initiator having an ability to initiate polymerization image-wise remains after image-wise inactivation of the polymerization-initiating ability of the initiator which was fixed over the whole area of a substrate" as described later.

Specifically, mention is made of, for example, a method in which a photoresist material for fine processing is provided on a substrate, the substrate having the photoresist is image-wise exposed to light, developed to remove the resist and treated with a polymerization initiator having a terminal group that can be bonded to the substrate (hereinafter, sometimes simply called "polymerization initiator") to image-wise fix the polymerization initiator on the exposed surface of the substrate and a method described in JP-A No. 2002-283530 in which an initiator having a terminal group that can be bonded to a substrate is allowed to adhere to a plate having a convex pattern on the surface thereof and then transferred to the surface of the substrate, and the initiator is fixed on only a region corresponding to the convex pattern. It is also possible to use a method in which an initiator is fixed over the whole area of a substrate and then image-wise exposed to light to inactivate the polymerization-initiating ability of the initiator in the region exposed to light so that the initiator fixed on the region not exposed to light maintains its activity. From the viewpoint of easiness of operation and applicability to larger area, it is preferable to use the finally mentioned method which involves inactivating of the initiator.

That is, the step (a) of image-wise forming a region having an ability to initiate polymerization on the surface of a substrate preferably involves a process (a-1) of fixing an initiator over the whole area of a substrate and a process (a-2) of image-wise giving energy to the fixed initiator to inactivate the initiator in the region given energy thereby forming a pattern of the inactivated initiator in the region given energy/non-inactivated initiator in the region not given energy.

As the method of locally fixing a polymerization initiator having activity toward the surface of a substrate, a method in which sulfonyl chloride, a polymerization initiator, is fixed to a solid surface and then inactivated with light is proposed in JP-A No. 11-263819. However, since sulfonyl chloride is gradually decomposed and inactivated by moisture in air, such method is not practically usable. The present inventors searched for initiators which can be preferably used in the pattern forming method, and as a result, they found that α-halogenated esters, which are highly stable with respect to time passage, have physical property of being decomposed by light to lose (inactivate) their initiating ability, and can be used as initiators to form practical patterns, whereby the invention was completed.

Hereinafter, a specific method for carrying out this process is described in more detail by reference to examples, but the invention is not limited to the process described below.

(Substrate)

The substrate usable in the invention may be any substrate made of an inorganic material, such as a glass plate, a silicon plate, an aluminum plate or a stainless steel plate as well as a substrate made of an organic material such as a polymer.

Examples of the substrate made of an inorganic material include, in addition to the substrates illustrated above, a metal plate made of gold, silver, zinc or copper, a substrate provided thereon with a metal oxide such as ITO, tin oxide, alumina or titanium oxide.

Examples of the usable polymer substrate include substrates made of resin materials selected from polyethylene, polypropylene, polystyrene, cellulose diacetate, cellulose triacetate, cellulose propionate, cellulose butyrate, cellulose acetate butyrate, cellulose nitrate, polyethylene terephthalate, polycarbonate, polyvinyl acetal, polyurethane, epoxy resin, polyester resin, acrylic resin and polyimide resin. When the polymer substrate is used, a functional group such as hydroxyl group or carboxyl group may be introduced onto the surface of the substrate by corona treatment or plasma treatment in order to improve the binding of the substrate to an initiator having a reactive functional group.

(Polymerization Initiator)

The initiator may be any known compound having both a moiety that initiates polymerization upon exposure to light (also referred to hereinafter as "initiating site") and a moiety that can be bonded to a substrate (also referred to hereinafter as "binding site") in the same molecule. For example, the following compounds can be mentioned.

As the initiating site, generally, an organic halide (for example, an ester compound having a halogen at the α-position or a compound having a halogen at a benzyl position) or a halogenated sulfonyl compound is introduced as a partial structure. A compound having a group working in place of halogen, for example a diazonium group, azido group, azo group, sulfonium group or oxonium group may also be used insofar as the compound has function as an initiator similar to the above halogenated compound.

Specifically, examples of the compound which can be introduced as the initiating site include compounds represented by the following general formulae (1) to (7):

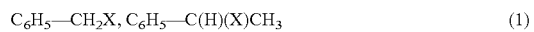  (1)

  (2)

In the general formulae (1) and (2), $C_6H_5$ represents a phenyl group, and X represents a chlorine atom, a bromine atom or an iodine atom.

$$R^1—C(H)(X)—CO_2R^2 \quad (3)$$

$$R^1—C(CH_3)(X)—CO_2R^2 \quad (4)$$

$$R^1—C(H)(X)—C(O)R^2 \quad (5)$$

$$R^1—C(CH_3)(X)—C(O)R^2 \quad (6)$$

In the general formulae (3) to (6), $R^1$ and $R^2$ each independently represent a hydrogen atom, an alkyl group having 1-20 carbon atoms, an aryl group having 6-20 carbon atoms, or an aralkyl group having 7-20 carbon atoms, and X represents a chlorine atom, a bromine atom or an iodine atom.

$$R^1—C_6H_4—SO_2X \quad (7)$$

In the general formula (7), $R^1$ has the same definition as the above definition of $R^1$, and X has the same definition as the above definition of X.

From the viewpoint of stability with respect to time passage, the α-halogen ester compound is particularly preferable as the initiating site of the initiator. In the above examples, ester compounds each having a halogen atom at a position and compounds each having a halogen atom at a benzyl position are hydrophobic, while compounds each including sulfonyl halide as a partial structure are hydrophilic.

The binding site in the initiator, that is, the substrate-binding group (functional group that can be bonded to a substrate) may be a thiol group, a disulfide group, an alkenyl group, a crosslinking silyl group, a hydroxyl group, an epoxy group, an amino group and an amide group. Particularly preferable substrate-binding group among these groups are a thiol group and a crosslinking silyl group.

Examples of the initiator having an initiating site and a binding site include, for example, compounds represented by the following general formula (8):

$$R^4R^5C(X)—R^6—R^7—C(H)(R^3)CH_2—[Si(R^9)_{2-b}(Y)_bO]_m—Si(R^{10})_{3-a}(Y_a) \quad (8)$$

In the general formula (8), $R^3$, $R^4$, $R^5$, $R^6$ and $R^7$ have the same definition as that of $R^1$ and $R^2$, and X has the same definition as the above definition of X. $R^9$ and $R^{10}$ each independently represent an alkyl group having 1-20 carbon atoms, an aryl group having 1-20 carbon atoms, an aralkyl group having 1-20 carbon atoms or a triorganosiloxy group represented by $(R')_3SiO—$ wherein R' represents a monovalent hydrocarbon group having 1-20 carbon atoms, and the three R' groups may be the same as or different from each other. When two or more $R^9$ groups are present or two or more $R^{10}$ groups are present, the groups may be the same as or different from each other.

Y represents a hydroxyl group, a halogen atom or a hydrolyzable group, and when two or more Y groups are present, the groups may be the same as or different from each other.

And a represents an integer of 0, 1, 2 or 3, b represents an integer of 0, 1 or 2, and m represents an integer of 0 to 19. Further, the relationship $a+mb \geq 1$ is satisfied.

Among the compounds represented by the general formula (8), compounds represented by the following general formulae (8-1) to (8-7) are preferable:

$$XCH_2C(O)O(CH_2)_nSi(OCH_3)_3 \quad (8-1)$$

$$CH_3C(H)(X)C(O)O(CH_2)_nSi(OCH_3)_3 \quad (8-2)$$

$$(CH_3)_2C(X)C(O)O(CH_2)_nSi(OCH_3)_3 \quad (8-3)$$

$$(CH_3)_2C(X)C(O)O(CH_2)_nSiCl_3 \quad (8-4)$$

$$XCH_2C(O)O(CH_2)_nSiCl_3 \quad (8-5)$$

$$CH_3C(H)(X)C(O)O(CH_2)_nSi(CH_3)(OCH_3)_2 \quad (8-6)$$

$$(CH_3)_2C(X)C(O)O(CH_2)_nSiCl_3 \quad (8-7)$$

In the general formulae (8-1) to (8-7), X represents a chlorine atom, a bromine atom or an iodine atom, and n represents an integer of 0 to 20.

Other examples of the initiator having an initiating site and a binding site include compounds represented by the following general formula (9):

$$(R^{10})_{3-a}(Y)_aSi—[OSi(R^9)_{2-b}(Y)_b]_m—CH_2—C(H)(R^3)—R^{11}—C(R^4)(X)—R^8—R^5 \quad (9)$$

In the general formula (9), $R^3$, $R^4$, $R^5$, $R^7$, $R^8$, $R^9$, $R^{10}$, a, b, m, X and Y respectively have the same definitions as defined above.

Among the compounds represented by the general formula (9), compounds represented by the general formulae (9-1) to (9-6) are preferable:

$$(CH_3O)_3SiCH_2CH_2C(H)(X)C_6H_5 \quad (9-1)$$

$$Cl_3SiCH_2CH_2C(H)(X)C_6H_5 \quad (9-2)$$

$$Cl_3Si(CH_2)_2C(H)(X)—CO_2R \quad (9-3)$$

$$(CH_3O)_2(CH_3)Si(CH_2)_2C(H)(X)—CO_2R \quad (9-4)$$

$$(CH_3O)_3Si(CH_2)_3C(H)(X)—CO_2R \quad (9-5)$$

$$(CH_3O)_2(CH_3)Si(CH_2)_3C(H)(X)—CO_2R \quad (9-6)$$

In the general formulae (9-1) to (9-6), X represents chlorine, bromine or iodine, and R represents an alkyl group having 1-20 carbon atoms, an aryl group having 1-20 carbon atoms or an aralkyl group having 1-20 carbon atoms.

Hereinafter, a preferable embodiment of this process, that is, [the process including a process (a-1) of fixing an initiator to the surface of a substrate and a process (a-2) of image-wise giving energy to the fixed initiator to inactivate the initiator in the region given energy to form a pattern of the inactivated initiator in the region given energy/non-inactivated initiator in the region not given energy] is described.

The initiator in the process (a-1) of fixing an initiator to the surface of a substrate, and the process for fixing it via a substrate-binding group to the surface of the substrate, are identical with those described above. Now, the method of exposing the fixed initiator to patterned light is described.

In the invention, the method of applying energy in an image-like manner is not particularly limited, and a method involving light exposure or heating can be used insofar as the method can give energy capable of decomposing the initiating site thereby inactivating the ability to initiate polymerization, however from the viewpoint of cost and device simplicity, a method involving irradiation with active rays is preferably used.

When irradiation with active rays is used to give energy image-wise, scanning light exposure based on digital data or pattern light exposure using a lith film can be used.

Examples of the method of giving energy used in forming an image include a method involving image-like heating and a method involving writing with radiation such as light exposure. As specific means, irradiation with lights by an infrared laser, a UV lamp, a visible light, or the like, electron beam irradiation with γ rays or the like, or heating with a thermal head or the like can be employed. Examples of the light source used in irradiation with radiations include a mercury lamp, a metal halide lamp, a xenon lamp, a chemical lamp and a carbon arc lamp. Examples of the radiation include electron rays, X rays, ion beams and far infrared rays. Further, g ray, i ray, deep-UV rays, high-density energy beams (laser beams) can also be used.

[Step (b) of Forming Graft Polymer by Atom Transfer Radical Polymerization on Region Having Ability to Initiate Polymerization to Form Hydrophilic/Hydrophobic Pattern Comprising Regions Having Graft Polymer Formed and Not Formed]

Methods of forming a pattern with a graft polymer by using an atom transfer radical polymerization method are known in the art, and such methods can be applied to the invention.

For example, JP-A No. 11-263819 discloses a method of producing a graft-surface solid, which method comprises fixing an initiator by monomolecular accumulation on a substrate, then inactivating polymerization-initiating groups in a region divided in a predetermined pattern by irradiation with light, and then allowing proceeding of graft-polymerizing, by atom transfer radical polymerization, only in a region where polymerization-initiating groups maintaining their activity are present. Further, a method of causing atom transfer radical polymerization by allowing an initiator to image-wise adhere by micro-contact printing is described in *Macromolecules*, vol. 33, (2000):597. These methods are intended to form a graft pattern, and it is not suggested that the resulting pattern is utilized as an image material. The present inventors found that this pattern forming method can be applied preferably to the substance adherence pattern forming method according to the invention.

The inventors have proposed the pattern forming method of the invention by paying attention to the ability of a graft polymer chain to adsorb material and the uniform molecular weight of graft polymers obtained by atom transfer radical polymerization. Further, the invention is based on a finding that, for example, when the resulting pattern is allowed to adsorb a colorant to form an image, excellent image formability can be obtained.

As described above, an initiator having (maintaining) a polymerization-initiating ability formed in a pattern is graft-polymerized preferably with a monomer having hydrophilicity/hydrophobicity opposite to that of the initiator.

(Monomer Used in Graft Polymerization)

The monomer used in graft polymerization in the invention may be any known monomer. When a hydrophobic initiator, for example, α-halogenated ester is used, a hydrophilic monomer should be used. Examples of the hydrophilic monomer include the following monomers, and a hydrophilic graft polymer can be formed by polymerizing such a monomer.

Examples of the hydrophilic monomer include, but are not limited to, (meth)acrylic acid, alkali metal salts thereof and amine salts thereof; itaconic acid, alkali metal salts thereof and amine salts thereof; amide monomers such as 2-hydroxyethyl (meth)acrylate, (meth)acrylamide, N-monomethylol (meth)acrylamide and N-dimethylol(meth)acrylamide; allylamine and hydrohalogenic acid salts thereof; 3-vinylpropionic acid, alkali metal salts thereof and amine salts thereof; vinylsulfonic acid, alkali metal salts thereof and amine salts thereof; ethylene glycol monomers such as diethylene glycol (meth)acrylate and polyoxyethylene glycol mono(meth)acrylate; N-vinyl compounds such as N-vinyl-2-pyrrolidone, N-vinylformamide, N-vinylacetamide, and N-methyl-N-vinylformamide; (meth)acrylate derivatives such as N-ethylacrylamide, diacetoneacrylamide, hydroxypropylacrylate, and methoxypolyethyleneglycol methacrylates; and vinylsulfonic acid, allylsulfonic acid, methallylsulfonic acid, styrenesulfonic acid, 2-acrylamide-2-phenylpropane sulfonic acid, 2-acrylamide-2-methylpropane sulfonic acid, N, N-dimethylaminoethyl (meth)acrylate, N, N-diethylaminoethyl(meth)acrylate, N, N-dimethylaminopropyl (meth)acrylamide, 2-sulfoethyl (meth)acrylate, 2-acrylamide-2-methylpropanesulfonic acid, acid phosphoxypolyoxy ethylene glycol mono(meth)acrylate, salts thereof.

In the case of forming a fine particle adsorption pattern or a conductive pattern, monomers having a quaternary ammonium group such as 2-trimethyl ammonium ethyl acrylate chloride are also preferable.

In the case of forming a fine particle adsorption pattern or a conductive pattern, particularly preferable hydrophilic monomers among these hydrophilic monomers are hydrophilic monomers each having an ionic group such as carboxyl group, sulfonic acid group, phosphonic acid group or ammonium group and hydrophilic monomers each having an ionic group that can dissociate into ions.

When a hydrophilic initiator is used, a hydrophobic monomer is preferably used. The term "a hydrophobic monomer" used herein refers to a monomer satisfying at least one of the following conditions:

(i) A monomer having a solubility in water of less than 1 g/100 g at 20° C.; and/or
(ii) A homopolymer of a monomer, the homopolymer having a solubility in water of less than 0.5 g/100 g at 20° C., that is, a homopolymer that is insoluble in water.

Examples of the hydrophobic monomer include styrene; acrylonitrile; ethylene; propylene; butene-1,4-methylpentene-1,2-hydroxyethyl methacrylate; vinyl chloride; vinylidene chloride; N-alkyl(meth)acrylamide derivatives such as N,N-diethylmethacrylamide, N,N-di-n-propylacrylamide, N-n-butyl(meth)acrylamide, N-tert-butyl(meth)acrylamide, N-n-hexyl(meth)acrylamide, N-n-octyl(meth)acrylamide, N-tert-octylacrylamide, and N-n-dodecyl(meth)acrylamide; (meth)acrylate derivatives such as ethyl (meth)acrylate, methyl (meth)acrylate, butyl (meth)acrylate, lauryl (meth)acrylate, 2-ethyl (meth)acrylate, and glycidyl (meth)acrylate. As described above, the hydrophobic monomer according to the invention has a solubility in water of less than 1 g/100 g at 20° C. The hydrophobic monomer according to the invention has a solubility in water of preferably less than 0.5 g/100 g, further preferably less than 0.1 g/100 g at 20° C.

In the specification including the above (b), the term "a hydrophilic monomer" refers to a monomer satisfying both the following conditions:

(i) A monomer having a solubility in water of 1 g/100 g or greater at 20° C.; and
(ii) A homopolymer of the above monomer having a solubility in water of 0.5 g/100 g or greater at 20° C., that is, a homopolymer that is soluble in water.

(Graft Polymerization Method)

The invention is characterized by applying atom transfer radical polymerization to formation of the graft polymer. Hereinafter, atom transfer radical polymerization is briefly described.

Atom Transfer Radical Polymerization

In usual radical polymerization, since the rate of polymerization is high and the reaction is easily terminated by coupling of radicals, it is considered difficult to regulate the molecular weight of the polymer. However, it is known that when "living radical polymerization method" is employed, the reaction is hardly terminated. Accordingly, polymers having narrow molecular-weight distribution (Mw/Mn of about 1.1 to 1.5) can be obtained, and the control of the molecular weight can be easily achieved by the monomer/initiator ratio.

Among the "living radical polymerization methods", "atom transfer radical polymerization method", in which a vinyl monomer is polymerized in the presence of an organic halide or a halogenated sulfonyl compound as an initiator and a transition metal complex as a catalyst, is preferable for producing a vinyl polymer having a specific functional group. This is because "atom transfer radical polymerization method" has higher degree of freedom of design of the initiator and catalyst in addition to the characteristics of "living radical polymerization methods" since the initiator has a halogen group or the like at its terminal which group is fairy advantageous to a functional group exchange reaction.

As the atom transfer radial polymerization method, mention is made of methods described by Matyjaszewski et al: *Journal of American Chemical Society*, vol. 117, (1995):p. 5614; *Macromolecules*, vol. 28, (1995): p. 7901; *Science* vol. 272, (1996): p. 866; International Publication No. WO 96/30421; International Publication No. WO 97/18247; International Publication No. 98/01480; International Publication No. 98/40415; and Sawamoto et al.: *Macromolecules, vol. 28*, (1995): p. 1721; JP-A Nos. 9-208616 and 8-41117.

The term "atom transfer radical polymerization" used herein refers not only to usual atom transfer radical polymerization using an organic halide or a halogenated sulfonyl compound as an initiator as described above, but also to "reverse atom transfer radical polymerization", in which a general initiator for free radical polymerization such as peroxide is combined with a usual atom transfer radical polymerization catalyst such as a copper (II) complex in a highly oxidized state.

(Atom Transfer Radical Polymerization Catalyst)

The transition metal complex used as a catalyst in atom transfer radical polymerization is not particularly limited, and the catalysts described in International Publication No. WO 97/18247 can be utilized. Examples of Particularly preferable metal complex include complexes of 0-valent copper, monovalent copper, divalent copper, divalent ruthenium, divalent iron and divalent nickel.

In particular, copper complexes are preferable. Examples of monovalent copper compounds include cuprous chloride, cuprous bromide, cuprous iodide, cuprous cyanide, cuprous oxide and cuprous perchlorate. A bivalent ruthenium chloride tristriphenyl phosphine complex ($RuCl_2(PPh_3)_3$) is also preferable as a catalyst. When the ruthenium compound is used as a catalyst, an aluminum alkoxide is added as an activator. A divalent iron bistriphenyl phosphine complex ($FeCl_2(PPh_3)_2$), a divalent nickel bistriphenyl phosphine complex ($NiCl_2(PPh_3)_2$) and a divalent nickel bistributyl phosphine complex ($NiBr_2(PBu_3)_2$) are also preferable as catalysts.

When the copper compound is used as a catalyst, its ligand may be a ligand described in International Publication No. WO 97/18247. The ligand is not particularly limited, however is preferably an amine-based ligand, more preferably a ligand such as aliphatic amine, for example 2,2'-bipyridyl and derivatives thereof, 1,10-phenanthroline and derivatives thereof, trialkylamine, tetramethyl ethylene diamine, pentamethyl diethylene triamine, and hexamethyl(2-aminoethyl) amine. In the invention, an aliphatic polyamine such as pentamethyl diethylene triamine or hexamethyl(2-aninoethyl) amine is preferable.

The amount of the ligand used under usual conditions of atom transfer radical polymerization is determined based on the coordination number of transition metal and the number of ligand groups to coordinate, and is predetermined such that the two numbers are nearly equal. For example, the molar ratio of 2,2'-bipyridyl or a derivative thereof to CuBr is usually 2, and the molar ratio of pentamethyl diethylene triamine to CuBr is 1.

When the ligand is added to initiate polymerization and/or the ligand is added to regulate the activity of a catalyst, the amount of the metal atom is not particularly limited, but preferably the metal atom is in excess of the ligand. The expression "in excess" or "amount exceeds" as used herein, mean that there are more positions on metal molecules which positions can be coordinated to than coordinating groups on ligand molecules. In other words, the expression means that a total valence number of metal molecules exceeds the number of coordinating groups on ligand molecules. The ratio of the coordination positions to the coordinating groups is preferably 1.2 or more, more preferably 1.4 or more, still more preferably 1.6 or more, most preferably 2 or more.

(Reaction Solvent)

In the invention, the graft polymerization reaction can be carried out in the absence or presence of solvents. Examples of the solvent include hydrocarbon solvents such as benzene and toluene; ether solvents such as diethyl ether, tetrahydrofuran, diphenyl ether, anisole and dimethoxy benzene; halogenated hydrocarbon solvents such as methylene chloride, chloroform and chlorobenzene; ketone solvents such as acetone, methyl ethyl ketone and methyl isobutyl ketone; alcohol solvents such as methanol, ethanol, propanol, isopropanol, n-butyl alcohol and tert-butyl alcohol; nitrile solvents such as acetonitrile, propionitrile and benzonitrile; ester solvents such as ethyl acetate and butyl acetate; carbonate solvents such as ethylene carbonate and propylene carbonate; and water. These solvents can be used alone or in combination of two or more thereof.

The graft polymerization reaction in the solvent is carried out generally by adding a monomer to the solvent, adding a catalyst if necessary, then dipping a substrate having an initiator fixed thereon in the solvent, and reacting it for a predetermined period.

The graft polymerization reaction in the absence of the solvent is carried out generally at room temperature or under heating at a temperature of up to 100° C.

[Step (c) of Adhering Substance to the Hydrophilic or Hydrophobic Region of Hydrophilic/Hydrohphobic Pattern]

The substance that is adhered to the hydrophilic/hydrophobic region is not particularly restricted. Any substance having an ability to adhere to a selected region can be appropriately selected and used. Surface-treatment for improving the adhesiveness may be employed to expand the range of substaneces that can be used in the invention. Various patterns utilizing characteristics of respective substances can be provided by the pattern forming method according to the invention.

When a hydrophilic group on a hydrophilic polymer has a negative charge such as in the case of sulfonate or carboxylate, a substance having a positive charge can be adhered to the hydrophilic polymer.

By utilizing such an ionic interaction a substance adheres to a pattern strongly, whereby, with a small amount of a substance, a substance adherence pattern having excellent durability is provided.

When a graft polymer is hydrophobic, a hydrophobic substance can be adhered to the graft polymer. For example, a hydrophobic ink for printing can be adhered to the graft polymer. In this case, visible image is formed in accordance with the pattern. The substance to be adhered to the pattern may be a colorant, a fine particle having a function, a conductive material, or the like. Specific embodiments of the pattern forming method are explained in the following.

[Step (c1) of Allowing Colorant to Adhere to the Hydrophilic or Hydrophobic Region of Hydrophilic/Hydrophobic Pattern]

A colorant capable of forming a visible image is allowed to adhere to the hydrophilic/hydrophobic pattern obtained above, to form a visible image. The colorant allowed to adhere to the hydrophilic/hydrophobic pattern may be an organic or inorganic material insofar as it can form a visible image. The material capable of forming a visible image refers to a material absorbing light in the visible wavelength range, and examples of such materials include colored dyes or pigments, light-impermeable pigments and fine metal particles. Since uniform graft polymers having narrow molecular-weight distribution are formed in the invention, when a dye is used as the colorant, the dye is adsorbed at uniform density onto the graft polymers to give an image superior in uniformity of color tone and density, and thus the effect of the invention is significant in this embodiment.

(Relationship Between Polar Group of Hydrophilic Polymer and Colorant)

Specifically, when the hydrophilic group of the hydrophilic polymer is negatively charged, for example, in the form of sulfonate and carboxylate, a positively charged molecule, for example a cationic dye, can be adsorbed to form a visible image.

Examples of the cationic colorant usable in such image formation include cationic dyes, positively charged inorganic pigments, fine metal particles, coated pigments having a cationic surface layer formed on the surface thereof, and coated metal fine particles having a cationic surface layer formed on the surface thereof.

As the cationic dye which can be used, a known dye can be suitably selected depending on purposes such as color tone and image density. It is considered that since such a cationic dye is electrically attracted to the surface of an image-recording layer by functions of the acidic groups (sulfonic acid group, carboxylic acid group) on the hydrophilic polymer as polarity-converting groups, the dye permeates not only into the surface but also into the inside of the image-recording layer, and the cationic dye is bonded to the acidic groups to finally form an image. As a result, from a small amount of the dye, a highly fast image having the dye adsorbed strongly thereon is formed by ionic interaction.

Examples of the cationic dye include dyes each having an alkylamino or aralkylamino bond at the terminal of a chromophore, dyes each having an acid amide bond such as a sulfonic acid alkyl amide bond, azo dyes each having a group capable of forming a cation, methine dyes, and heterocyclic compounds such as thiazole/azo dyes. Examples of the skeleton of the cationic dye include triphenyl methane, diphenyl methane, xanthene, acridine, azine, thiazine, thiazole, oxazine and azo. Such dyes are described in detail in Yutaka Hosoda, *Shin Seryou Kgaku* (New Dye Chemistry)(Gihodo, 1957), 316-322.

Other image forming mechanism is that when the hydrophilic group of the hydrophilic polymer is a positively charged group such as ammonium group, a negatively charged molecule, for example an acidic dye, is adsorbed by the hydrophilic polymer to form a visible image.

Examples of the anionic colorant usable in such image formation include acidic dyes, negatively charged inorganic pigments, fine metal particles, coated pigments having an anionic surface layer formed on the surface thereof, and coated fine metal particles having an anionic surface layer formed on the surface thereof.

As the acidic dye which can be used, a known dye can be suitably selected in accordance with purposes such as color tone and image density. Examples of the acidic dye include dyes based on azo, anthraquinone, triphenyl methane, xanthene, azine and quinoline, and any of these dyes can be arbitrarily used. Specifically, C. I. Acid Yellow, C. I. Acid Orange 33, C. I. Acid Red 80, C. I. Acid Violet 7, C. I. Acid Blue 93 may be used, and these dyes are described in detail in *Senryo Binran* (Dye Handbook) ed. the Society of Synthetic Organic Chemistry (Maruzen Co., Ltd., 1970), 392-471.

In accordance with the necessity, one or more colorants can be used in forming visible images. To obtain a desired color tone, multiple colorants may be mixed before use.

The method of allowing the hydrophilic/hydrophobic region to adsorb the colorant may be a method which involves applying a solution or dispersion of colorant molecules onto the surface of a substrate having the hydrophilic/hydrophobic pattern formed through the foregoing steps (a) and (b) or a method which involves dipping the substrate having the hydrophilic/hydrophobic pattern formed thereon into the solution or dispersion. In this application or dipping, the solution or dispersion is contacted with the surface of the pattern forming material for preferably about 10 seconds to 60 minutes, more preferably about 1 minute to 20 minutes, so that an excess of the colorant can be supplied and sufficient adhesion between the colorant and the desired hydrophilic/hydrophobic pattern region can be obtained.

From the viewpoint of the sharpness, color tone and durability of images, it is preferable that the colorant is adsorbed by the pattern forming region as much as possible. From the viewpoint of the efficiency of adsorption, the concentration of the solution or dispersion is preferably at least 10 to 20% by weight.

In the invention, since the graft polymers having an ability to adsorb the colorant have a uniform molecular weight, even if the colorant is supplied in excess, the colorant can be adsorbed under uniform conditions by the entire graft polymer-forming region, to provide an image with qualities excellent in uniform color tone and color density without uneven color tone and uneven color density caused by uneven distribution of the colorant molecules.

The amount of the colorant used can be determined in accordance with the image forming mechanism or the intended object, but when the colorant is introduced through ionic adsorption, images of high density and high sharpness can be formed from an amount of the colorant smaller than that of a coloring material or colored material used in general image forming materials.

When a resin film in which a layer containing hydrophobic polymers also serves as a support is used to adsorb light-impermeable materials such as inorganic pigments and metal pigments or light-permeable colored dyes, light-permeable pattern forming materials and display materials, which can be used for OHP or street decoration, can also be easily obtained.

As a method of using other image forming mechanism, a method which involves allowing a hydrophobic material such as oil ink to adhere to the hydrophobic region can also be mentioned. When such image forming mechanism is used, since the colorant adheres only to the surface of a hydrophobic region where hydrophilic graft polymers are not formed, this image forming method is suitable for formation of monochromatic images.

(Application to Planographic Printing Plate)

The hydrophilic/hydrophobic pattern obtained by the image forming method of the invention can also be used in a planographic printing plate. For example, in the case of a planographic printing plate provided with a hydrophilic/hydrophobic pattern having hydrophilic graft polymers formed in a pattern, wetting water and oil ink are supplied to the surface of the printing plate and the wetting water is adsorbed by the hydrophilic pattern to form a non-image region, whereas the surface of the hydrophobic pattern acts as a hydrophobic oil ink-receiving region to form an image region. Since the graft hydrophilic polymers are bound directly to the support in hydrbphilic pattern region and have uniform molecular weights, water can be adsorbed uniformly and stably by the hydrophilic region, to form an image excellent in qualities without stain in the non-image region. And since the image region is constituted by the hydrophilic support and a region having the remaining hydrophobic initiator, with excellent durability of the hydrophilic region, the obtained printing plate has excellent printing durability.

The support used in the planographic printing plate may be the same substrate as in forming a visible image as described above. However, particularly for use in the planographic printing plate, a substrate comprising a hydrophobic polymer layer (hydrophobic resin layer) formed on a surface of a polyester film such as PET or on a surface of an aluminum plate is preferably used from the viewpoint of dimensional stability.

According to the image forming method of the invention, sharp images can be formed on the surface of an arbitrary substrate by relatively easy treatment, and the formed images are excellent in durability and can thus be used for various purposes. Therefore, various images can be easily formed in accordance with purposes, and images with large area applicable to various purposes such as displays can also be easily formed.

[Step (c2) of Allowing Graft Polymer to Adsorb Fine Particles]

In the invention, a pattern of adsorbed fine particles is formed by allowing the graft polymer obtained above to adsorb fine particles.

(Fine Particles)

The fine particles according to the invention may be any fine particles which can be adsorbed by the graft polymer in the invention. In a preferable embodiment, since the graft polymer has a polar group as described above, the fine particles preferably have physical properties that allow interaction with the polar group on the graft polymer. The fine particles used may be suitably selected in accordance with the object of the functional surface to be formed.

The particle diameter of the fine particles can also be suitably selected. The particle diameter of the fine particles is varied based on the object. Generally speaking, the particle diameter is preferably in the range of 0.1 nm to 1 μm, more preferably 1 nm to 300 nm, still more preferably 5 nm to 100 nm.

In a preferable embodiment of the invention, the fine particles are adsorbed in an ionic manner, and thus their particle diameter and adsorbed amount are naturally limited based on the surface charge of the fine particles and the number of ionic groups.

In the invention, when the polar group is, for example, an ionic group, the fine particles are adsorbed by ionic groups of the graft polymers, for example, in a form in which the fine particles are arranged regularly to form nearly an monolayer, or arranged in the form of a multi-layer by adsorption of each nano-scale fine particle onto each ionic group of the long graft polymer, based on the state of ionic groups of the graft polymers.

Hereinafter, the functional fine particles usable as the fine particles in the invention are described in more detail.

1. Fine Particles for Optical Materials

When the fine particle adsorption pattern forming method according to the invention is used in production of optical materials, at least one kind of fine particle selected from fine resin particles and fine metal oxide particles is preferably used as the functional fine particles.

The fine resin particle preferably comprises an organic polymer in their central region called the core. Preferable examples of the fine metal oxide particles include silica ($SiO_2$), titanium oxide ($TiO_2$), zinc oxide (ZnO) and tin oxide ($SnO_2$). Transparent pigments such as calcium carbonate, aluminum hydroxide, magnesium hydroxide, clay and talc, and fine pigment particles called white pigments can also be used insofar as they have preferable shape described below.

From the viewpoint of durability, the fine resin particle preferably has higher hardness. Specifically, the fine resin particle may be a spherical fine particle made of resin such as an acrylic resin, a polystyrene resin, a polyethylene resin, an epoxy resin or a silicon resin. Among them, fine crosslinked resin particle is preferable. In this use, the particle diameter of the fine particle is preferably in the range of 10 nm to 900 nm, more preferably in the range of 100 nm to 700 nm, which partially overlaps the wavelength range of visible light. In this embodiment, the particles that are bonded to the graft polymers through ionic force are arranged regularly to form nearly a monolayer.

When the fine particle adsorption pattern forming method according to the invention is employed for preparation of color filters, sharp cut filters and non-linear optical materials used in optical instruments, the functional fine particle used may be a fine particle made of semiconductor such as CdS or CdSe or a fine particle made of metal, such as gold. In this case, when silica glass or alumina glass is used as the substrate, the fine particles can not only be used preferably in color filters etc. but can also be expected to be used for non-linear optical materials such as light switch, light memory and the like because high three-dimensional non-linear photosensitivity was confirmed. Specifically, the fine particle used may be a noble metal such as gold, platinum, silver or palladium or an alloy thereof. And from the viewpoint of stability, materials that does not dissolve rapidly in alkali, such as gold and platinum, are preferable.

When the fine particle adsorption pattern forming method according to the invention is applied to preparation of the non-linear optical materials, the fine metal (compound) particle is preferably superfine particle which has an average particle diameter of 10 to 1000 angstroms and consists of an element such as gold (Au), silver (Ag), copper (Cu), platinum (Pt), palladium (Pd), rhodium (Rh), osmium (Os), iron (Fe), nickel (Ni), or ruthenium (Ru) or an alloy comprising at least one of these metals. This average particle diameter may be that of primary or secondary particle, and the particle is preferably a particle that does not scatter visible ray. Among these particles, a fine particle of a noble metal selected from Au, Pt, Pd, Rh and Ag or a fine particle of a metal selected from Ti, V, Cr, Mn, Fe, Ni, Cu, Zn, Cd, Y, W, Sn, Ge, In and Ga are preferable, wherein the particle has a diameter of 10 nm or less and is dispersed independently in a solvent such as toluene.

When these superfine particles are used to produce a non-linear optical material by a usual method such as sol-gel method, dipping, sputtering, ion injection or melting-precipitation, the particles are aggregated very easily to cause problems such as difficulty in increasing the concentration of the particles in a composite and a reduction in productivity. In particular, when a composite containing fine particles at low concentration is used, the fine particles contribute less to physical properties. Accordingly, the use of such a composite is limited, and the composite is not suitable for use in an image memory or an optical integrated circuit, which utilizes a three-dimensional non-linear optical effect. According to the invention, since the fine particles are bound in an ionic manner to ionic groups on the surface of a substrate, and the ionic groups are present at so high density as to easily increase the density of the fine particles, the optical material according to the invention is used particularly preferably in non-linear optical materials.

2. Fine Particles for Organoluminescence Elements

When the fine particle adsorption pattern material in the invention is applied to preparation of an organoluminescence element, fine particles consisting of aggregated organic pigment molecules emitting light upon excitation with hot carriers are used as the functional fine particles to form a layer containing the fine particles in the surface of a substrate having an electrode, whereby an organoluminescence element can be formed. The organic pigment used includes, but is not limited to, the following organic pigments, and can be selected suitably in consideration of intended use etc.

Organic Pigment

Mention is made of oxazole pigments emitting blue light, such as p-bis[2-(5-phenyloxazole)]benzene (POPOP); coumarin pigments emitting green light, such as coumarin 2, coumarin 6, coumarin 7, coumarin 24, coumarin 30, coumarin 102 and coumarin 540; rhodamine (red) pigments emitting red light, such as rhodamine 6G, rhodamine B, rhodamine 101, rhodamine 110, rhodamine 590 and rhodamine 640; and pigments emitting light in the near infrared range, such as oxazine 1, oxazine 4, oxazine 9 and oxazine 118. Such oxazine pigments are preferable for optical functional elements which are suitable particularly to optical communication.

Cyanine pigments such as phthalocyanine and cyanine iodide can also be mentioned. When cyanine pigments are selected, cyanine pigments that easily dissolve in a polymer such as acrylic resin are preferably selected from the viewpoint of forming a thinner film. Examples of such pigments include POPOP, coumarin 2, coumarin 6, coumarin 30, rhodamine 6G, rhodamine B and rhodamine 101.

Other examples include fine particles of organic molecules used in organic electroluminescence (EL) films, for example 8-hydroxyquinoline aluminum ($AlQ_3$), 1,4-bis(2,2-diphenylvinyl) biphenyl, polyparaphenylene vinylene (PPV) derivatives, distyrylarylene derivatives, stylyl biphenyl derivatives, phenanthroline derivatives, and fine particles of mediums obtained by adding an additive to these organic molecules.

3. Other Fine Particles

Preferable examples of the fine particle in the invention include not only the fine particles described above, but also fine particles of metal oxides such as iron oxide, titanium oxide, zinc oxide, cobalt oxide, chrome oxide, tin oxide and antimony oxide and superfine particles made of inorganic compounds such as silicon oxide, zirconium oxide, titanium oxide, alumina, magnesium oxide and tin oxide, or metals such as aluminum, tin and zinc.

The fine particle according to the invention have been described by reference to the specific examples 1 to 4, but the invention is not limited to the examples. And as a matter of course, a pattern of adsorbed fine particles having a functional surface utilizing the physical properties of the functional fine particles can be formed in various forms in accordance with the object.

Physical Properties of Surface of Fine Particles

When the fine particle has a charge, as in the case of fine silica particles, a pattern of the graft polymer having a polar group that has a charge opposite to that of the fine particle may be introduced to the surface of the support.

When the fine particle does not have a charge, as in the case of fine gold particle, a particle surface modifier having a charge can be used for preparing a fine particle having a charge and then, the fine particle having a charge can be adsorbed by a pattern of the graft polymer. According to the latter method, the fine particle can be selected from a broader range of materials.

From the viewpoint of durability, it is preferable that the fine particles are adsorbed as much as possible by ionic groups present on the surface of the support. From the efficiency of exhibiting functions of the functional surface, the concentration of the fine particles in a dispersion is preferably about 10 to 20% by weight.

The method of allowing the graft polymer to adsorb the fine particle to provide a pattern of the adsorbed fine particles may be (1) a method of image-wise applying a dispersion of the fine particle having a charge on the surface thereof onto a substrate having the graft polymer formed thereon, or (2) a method of dipping a substrate having a graft polymer image-wise formed thereon in a dispersion of the fine particle. In both of application and dipping, the dispersion is contacted with the substrate having ionic groups on the surface thereof for preferably about 10 seconds to 180 minutes, more preferably about 1 minute to 10 minutes, so that an excess of the charged fine particles can be supplied to give sufficient ionic bonding between the charged fine particles and the ionic groups.

(Adsorption of Fine Particles Onto Graft Polymer)

In a specific embodiment of adsorption of the fine particles, an ionic monomer such as positively charged ammonium is used as a polar group to image-wise form a graft polymer having an ammonium group on the surface of a substrate, and thereafter this substrate is dipped for a predetermined time in a dispersion of a fine silica particle, to adsorb the particles in accordance with the pattern, washed with water to remove an excess of the dispersion, and rubbed slightly with cotton to completely remove the particles adhering to a region other than the desired region, whereby a pattern layer comprising the fine silica particles adsorbed in a pattern is formed.

In this manner, the graft polymer is image-wise introduced onto the substrate thereby adsorbing the fine particles to form a pattern of the adsorbed fine particles having desired functions. The thickness of the pattern of the adsorbed fine particles can be selected based on the object. Generally speaking, the thickness is preferably in the range of 0.001 μm to 10 μm, more preferably 0.005 μm to 5 μm, most preferably 0.01 μm to 1 μm. When the film is too thin, scar resistance tends to be lowered, while the film is too thick, the contact characteristic tends to be lowered.

[Fine Particle Adsorption Pattern Material]

The fine particle adsorption pattern material according to the invention is prepared by image-wise forming a region having an ability to initiate polymerization on the surface of a substrate, forming a graft polymer on the region by atom transfer radical polymerization, and allowing the graft polymer to adsorb fine particles. And this pattern material can be obtained by the fine particle adsorption pattern forming method as described above.

[Step (c3) of Allowing Graft Polymer to Adsorb Conductive Material]

In this step, a conductive material is adsorbed by the graft polymer obtained above, to form a conductive pattern.

In this step, the method of allowing a conductive material to be adsorbed may be (A) a method of allowing the image-wise formed graft polymer to adsorb fine conductive particles or (B) a method of forming a conductive polymer layer on the image-wise formed graft polymer, and the method can be selected suitably in accordance with intended use.

Hereinafter, the method of allowing a conductive material to be adsorbed is described in more detail.

(A) Method of Allowing Image-wise Formed Graft Polymer to Adsorb Fine Conductive Particles The method (A) of allowing a conductive material to be adsorbed in the invention is a method in which fine conductive particles described later are adsorbed in an ionic manner by functional groups of the graft polymer based on the polarity of the functional groups of the graft polymer. According to the method, the molecules thus adsorbed are fixed strongly in nearly a monomolecular film state to attain sufficient electrical conductivity even in a small amount, and the method can be applicable to fine circuits.

Fine Conductive Particles

The fine conductive particles applicable to this method are not particularly limited insofar as they have electrical conductivity. And fine particles made of known conductive materials can be arbitrarily selected. Specifically, it is preferable to use at least one kind of fine particle selected from fine conductive resin particles, fine conductive or semi-conductive metal particles, fine metal oxide particles and fine metal particles.

As the fine conductive metal particles or fine metal oxide particles, powders of conductive metal compounds having a specific resistance of not higher than $1 \times 10^3 \Omega \cdot cm$ can be widely used. Specifically, elements such as silver (Ag), gold (Au), nickel (Ni), copper (Cu), aluminum (Al), tin (Sn), lead (Pb), zinc (Zn), iron (Fe), platinum (Pt), iridium (Ir), osmium (Os), palladium (Pd), rhodium (Rh), ruthenium (Ru), tungsten (W) and molybdenum (Mo), alloys thereof, tin oxide ($SnO_2$), indium oxide ($In_2O_3$), ITO (indium tin oxide) and ruthenium oxide ($RuO_2$) can be used.

Semi-conductive fine particles of metal oxides or metal compounds may also be used. Examples thereof include fine particles of oxide semiconductors such as $In_2O_3$, $SnO_2$, ZnO, CdO, $TiO_2$, $CdIn_2O_4$, $Cd_2SnO_2$, $Zn_2SnO_4$, $In_2O_3$—ZnO and fine particles of materials obtained by doping such oxide semiconductors with suitable impurities, fine particles of spinel type compounds such as MgInO and CaGaO, fine particles of conductive nitrides such as TiN, ZrN and HfN, and fine particles of conductive borides such as $LaB$.

The fine conductive particles described above can be used alone or in combination of two or more thereof.

Relationship Between Polarity of Hydrophilic Group of the Graft Polymer and the Fine Conductive Particle When the graft polymer formed in the invention has an anionic group such as a carboxyl group, sulfonic acid group or phosphonic acid group, the pattern region selectively has negative charge to adsorb a positively charged (cationic) fine conductive particle to form a conductive region (wire).

Examples of the cationic fine conductive particle include a fine particle of positively charged metals (oxides). The fine particle having positive charge on the surface thereof at high density can be prepared by, for example, a method of Toru Yonezawa et al., that is, a method described in T. Yonezawa, *Chemistry Letters*, (1999): p. 1061; T. Yonezawa, Langumuir, vol. 16, (2000): p. 5218; and T. Yonezawa, *Polymer preprints Japan*, vol. 49, (2000): p. 2911. Yonezawa et al. reported that metal-sulfur bonds can be used to form a surface of metal particles modified chemically at high density with positively charged functional groups.

When the graft polymer formed has a cationic group such as an ammonium group as described in JP-A No. 10-296895, the pattern region is selectively positively charged to adsorb negatively charged fine conductive particle to form a conductive region (wire). The negatively charged metal particle may be gold or silver particles obtained by reduction with citric acid.

The particle diameter of the fine conductive particle used in the invention is preferably in the range of 0.1 nm to 1000 nm, more preferably 1 nm to 100 nm. When the particle diameter is smaller than 0.1 nm, the fine particles tend to be mutually contacted to reduce electrical conductivity. When the particle diameter is greater than 1000 nm, the contact characteristic of the particle to the hydrophilic surface tends to worsen to deteriorate the strength of the conductive region.

It is preferable for durability that the fine particles are adsorbed as much as possible by ionic groups of the graft polymers. From the viewpoint of securing electrical conductivity, the concentration of the fine particles in a dispersion is preferably 0.001 to 20% by weight.

The method of allowing the hydrophilic group to adsorb the fine conductive particle may be a method of applying image-wise a solution or dispersion of the fine conductive particle having charge on the surface thereof onto a substrate having a graft polymer formed thereon, or a method of dipping a substrate having a graft polymer formed image-wise thereon in the solution or dispersion. In both of application and dipping, the solution or dispersion is contacted with the substrate of the pattern forming material for preferably about 10 seconds to 24 hours, more preferably about 1 minute to 180 minutes, so that an excess of the charged fine conductive particles can be supplied to give sufficient ionic bonding between the hydrophilic groups and the conductive particles.

One kind or plural kinds of fine conductive particle(s) can be used in accordance with necessity. To obtain desired electrical conductivity, the fine particles can be prepared by mixing a plurality of materials.

Method (B) of Forming Conductive Polymer Layer on Graft Polymer Formed Image-Wise The method (B) of allowing a conductive material to be adsorbed in the invention is a method which comprises allowing a conductive monomer as a conductive polymer precursor described later to be adsorbed in an ionic manner by a functional group of the graft polymer to cause polymerization reaction thereby forming a polymer layer (conductive polymer layer). The conductive polymer layer thus obtained is strong and excellent in durability. Further, the conductive polymer layer can be made very thin by regulating conditions such as monomer feeding rate, and thus obtained very thin conductive polymer layer is uniform and has uniform thickness.

The conductive polymer usable in this method may be any polymeric compound having an electrical conductivity of $10^{-6}$ s·cm$^{-1}$ or higher, preferably $10^{-1}$ s·cm$^{-1}$ or higher. Specific examples of the conductive polymer include substituted or unsubstituted conductive polyaniline, polyparaphenylene, polyparaphenylene vinylene, polythiophene, polyfuran, polypyrrole, polyselenofuran, polyisothianaphthene, polyphenylene sulfide, polyacetylene, polypyridyl vinylene and polyazine. These polymers can be used alone or in combination of two or more thereof in accordance with necessity. A mixture of the conductive polymer and another polymer not having electrical conductivity or a copolymer of the conductive monomers and other monomers not having electrical conductivity can be used so long as a desired electrical conductivity can be achieved.

The method of forming a conductive polymer layer by using the conductive polymer described above is not particularly limited, but from the viewpoint of forming a uniform thin film, the following method of using the conductive monomer is preferably used.

First, a substrate having the graft polymer formed thereon is dipped in a solution containing a polymerization catalyst such as potassium persulfate or iron(III) sulfate or a compound having an ability to initiate polymerization, and a monomer capable of forming a conductive polymer, for example 3,4-ethylenedioxythiophene, is added dropwise thereto under stirring. By doing so, the monomer capable of forming a conductive polymer is strongly adsorbed through interaction onto a functional group of the graft polymer, while the polymerization reaction of the monomer proceeds to form a very thin film of the conductive polymer on the graft polymer on the substrate, and this film serves as a conductive polymer layer.

By utilizing the polymerization reaction on the surface of the substrate, a thin film of the conductive polymer can be formed directly on the surface of a resin substrate such as PET. However, in this case, the conductive polymer film which cannot interact with the substrate is easily released, thus failing to form a film which is so strong as not to cause practical problems.

In the invention, since the conductive monomer adheres strongly to a functional group in the graft polymer through electrostatic or polar interaction between them, a polymer film formed by polymerization of the monomer exhibits strong interaction with the hydrophilic surface so that even if the film is thin, it can have sufficient strength against rubbing or scratching.

By selecting the materials such that the hydrophilic functional group is adsorbed by the graft polymer through anion (the graft polymer)-cation (the hydrophilic functional group) interaction, since the hydrophilic functional group is adsorbed as a counter anion toward the conductive polymer and functions as one kind of dope agent, the electrical conductivity of the conductive pattern material can be further improved. Specifically, when styrenesulfonic acid is selected as a hydrophilic group and thiophene as a material of the conductive polymer, the compounds interact with each other so that polythiophene having a sulfonic acid group (sulfo group) as a counter anion occurs at the interface between the hydrophilic surface and the conductive polymer layer, to function as a dope for the conductive polymer.

The thickness of the conductive polymer layer formed on the graft polymer is not particularly limited. However, the thickness is preferably in the range of 0.01 µm to 10 µm, more preferably 0.1 to 5 µm. When the thickness of the conductive layer is in this range, sufficient electrical conductivity and transparency can be achieved. A thickness of 0.01 µm or less is not preferable because electrical conductivity may be insufficient.

The conductive pattern obtained by the conductive pattern forming method according to the invention is excellent in strength and durability and capable of easily forming a conductive region in nano-scale, and thus various applications thereof including formation of circuits such as micro-machine and ultra-LSI can be expected.

Further, when a transparent film such as PET is used as the support, the resulting film can be used as a transparent conductive film having a pattern formed thereon. The transparent conductive film is usable in a transparent electrode for displays, light-controlling devices, solar batteries, touch panels and other transparent conductive films, and is particularly useful in an electromagnetic wave shield filter attached to CRT or plasma display. Since such electromagnetic wave shield filter requires high electrical conductivity and transparency, the conductive material is arranged preferably in a lattice pattern. Preferably, the width of the lines constituting the lattice is 20 to 100 µm and the width of the lattice is 50 to 600 µm. The lattice may not be necessarily divided by regular and straight lines and may be divided by curved lines.

In the invention, such arbitrary conductive patterns can be easily formed and used in various forms based on the object.

[Conductive Pattern Material]

The conductive pattern material of the invention is prepared by image-wise forming a region having an ability to initiate polymerization on the surface of a substrate, forming a graft polymer on the region by atom transfer radical polymerization, and allowing the graft polymer to adsorb a conductive material. And this conductive pattern material can be obtained by the above-described conductive pattern forming method.

EXAMPLES

Hereinafter, the present invention is described in more detail by reference to the Examples, but the invention is not limited to the Examples.

Example 1

(Fixation of Initiator to Silicon Substrate)

A silane coupling agent, (5-trichlorosilylpentyl)-2-bromo-2-methylpropionate, was synthesized according to a method described in C. J. Hawker et al. *Macromolecules* 32 (1999): 1424.

A silicon plate used as a substrate was dipped overnight in a Piranha liquid ($H_2SO_4$:$H_2O_2$=3:1), washed sufficiently with deionized water and stored in water. After the silicon wafer taken out from water was dried in an argon stream until the water on the surface was completely removed, the silicon wafer was dipped overnight in 1% solution of the silane coupling agent in anhydrous toluene. Thereafter, the silicon plate was taken out and washed with toluene and methanol, to give a silicon substrate having the terminal silane coupling agent fixed as an initiator on the surface thereof.

(Formation of Hydrophilic/Hydrophobic Pattern)

The silane coupling-modified silicon substrate on which the initiator (terminal silane coupling agent) synthesized in the method described above had been fixed was stuck to a mask pattern formed on a quartz plate, the mask pattern being a quartz mask which enabled exposure in a lattice pattern with a grid width of 25 µm and a grid interval of 100 µm manufactured by SK Electronics Co., Ltd. Then the substrate was irradiated for 20 minutes with a UV irradiator (UV irradiating device UVL-4001-N, a high-pressure mercury lamp, manufactured by Ushio Inc.). As a result, the initiator in the region exposed to light was inactivated.

(Synthesis of Graft Polymer)

As deionized water, water purified with Milli-Q Labo (Millipore Corporation) was used (18 MΩ). 55.2 g of the deionized water was introduced into a 1 liter separable flask, and then 16 g (0.40 mol) of sodium hydroxide was dissolved therein. Then, this solution was adjusted to pH 7 by adding 28.8 g (0.40 mol) of acrylic acid dropwise thereto under cooling on ice. 0.891 g (9.0 mmol) of copper(I) chloride and 3.12 g (20.0 mmol) of 2,2'-bipyridyl were added to the solution under Ar flow and stirred to form a uniform solution.

The silicon wafer which had been exposed to light by the method described above was dipped in the solution and left overnight under stirring. After the reaction was terminated, the silicon wafer was washed with water. In this way, a substrate K, on which a graft polymer was fixed, was obtained. The height of the resulting pattern was confirmed with AFM (NANOPIX 1000, Seiko Instruments Inc.). As a result, it was revealed that the formed pattern had a uniform thickness.

FIG. 1 is a graph showing the thickness of a section, in the height direction, of the silicon substrate measured with AFM. As can be seen from this graph, a hydrophilic graft pattern having a thickness of about 60 nm was formed.

Example 2

(Fixation of Initiator to Silicon Substrate)

A silicon substrate having an initiator thereon was prepared in the same manner as in Example 1.

(Formation of Hydrophilic/Hydrophobic Pattern)

The silicon substrate was exposed in the same manner as in Example 1, except that a quartz mask (a quarz mask (FUJI No. 1, manufactured by SK Electronics Co., Ltd, a lattice pattern with grid width of 10 μm and grid interval of 200 μm) was used in place of the quartz mask used in Example 1.

(Synthesis of Graft Polymer)

The exposed silicon substrate was placed in a 1 liter separable flask. A solution containing 100 g of methyl methacrylate, 100 g of toluene, 0.891 g of cuprous chloride, and 3.12 g of 2, 2'-bipyridine was added to the flask. The solution in the flask was heated and kept at 90° C. for 8 hours in a stream of Ar while stirred. Then, the silicon substrate was taken out from the flask, and washed with aceton and dimethylformamide to obtain a substrate S, on which a graft polymer pattern was formed.

Comparative Example 1

A polyester resin (VIRON 200, manufactured by Toyobo.Co., Ltd) was dissolved in a mixed solvent of toluene and tetrahydrofuran (toluene:tetrahydrofuran=1:4) so that the concentration of the polymer resin became 15 wt %. This solution was applied to a glass substrate by a spinner at 1,000 rpm. The coat on the glass substrate was dried at 11520 C. for one minute to form a polyester resin layer having a thickness of 2 μm. Then, a solution obtained by dissolving 1 g of benzophenone in 10 g of acrylic acid was coated thinly on the polyester resin layer. The same mask pattern formed on a quartz plate as that used in Example 1, the mask pattern being a quartz mask which enabled exposure in a lattice pattern with a grid width of 25 μm and a grid interval of 100 μm manufactured by SK Electronics Co., Ltd., was placed on the benzophenone solution. This pattern forming plate precursor was exposed to radiation with a UV irradiator (UV irradiating device UVL-4001-N, a high-pressure mercury lamp, manufactured by Ushio Inc.) for 5 minutes. After the exposure, the mask film was removed, and the exposed plate was washed with water having a temperature of 50° C. to 70° C. for 3 hours to prepare a substrate R, on which an acrylic acid graft polymer pattern was formed.

As in Example 1, the obtained pattern of the acrylic acid graft polymer was observed with an AFM, and it was found that the height of the pattern varied between 30 nm and 100 nm.

Example 3

(Formation of Visible Image)

The substrate K, prepared in Example 1, was dipped for 10 minutes in 0.1% by weight aqueous solution of methylene blue (Wako Pure Chemical Industries, Ltd.) and washed with distilled water. As a result, methylene blue adhered selectively to the region which was not exposed to light, to give a blue vivid pattern image. By the observation with the naked eye, it was confirmed that the pattern image was uniform in density and color tone. When the unevenness of the density was measured with a Macbeth densitometer, the density varied between 0.5 and 0.7. In this measurement, image areas of four squares each having sides of 5 cm were measured.

Example 4

The substrate S, prepared in Example 2, was immersed in distilled water for 1 minute, whereby water was adsorbed by portions on the substrate S except the graft polymer pattern portions. Then, a hydrophobic ink (GEOS-G ink manufactured by Dainippon Ink and Chemicals, Incorporated) was applied to the substrate S with a rubber roller. As a result, the ink adhered only to the graft polymer pattern portions, which were hydrophobic, to give a sharp black pattern.

Example 5

A cationic graft polymer pattern substrate W was prepared in the same manner as in the preparation of the substrate K in Example 1, except that a mixture of 50 g of water and 30 g of 2-(methacryloyloxy)ethyldimethylethyl ammonium was used in place of the acrylic acid solution. Then the substrate W was stained with alizarin red S (manufactured by Dojindo Laboratories.), which is an anionic dye. As a result, a sharp red pattern was obtained.

Comparative Example 2

The substrate R, prepared in Comparative example 1, was stained with methylene blue to form visible image in the same manner as in Example 1. However, when the obtained image (pattern) was observed with the naked eye, it was found that the pattern was uneven. When the unevenness of the density was measured with a Macbeth densitometer, the density varied between 0.3 and 1.0. In this measurement, image areas of four squares each having sides of 5 cm were measured.

Example 6

(Application to a Planographic Printing Plate)

(Fixation of an Initiator to a PET Substrate)

A biaxially oriented polyethylene terephthalate (PET) film having a thickness of 188 μm (A4 100 manufactured by Toyobo Co., Ltd.) was subjected to oxygen glow treatment with a flat-plate magnetron sputtering device (CFS-10-EP70, Shibaura Eletec Corporation) for glow treatment.

Initial vacuum: $9 \times 10^6$ Torr
Oxygen pressure: $6.8 \times 10^3$ Torr
RF glow: 1.5 kw
Treatment time: 60 sec.

The glow-treated PET substrate was dipped overnight in the same manner as in Example 1 in 1% solution of the silane coupling agent (5-trichlorosilylpentyl)-2-bromo-2-methyl-propionate in anhydrous toluene. Thereafter, the PET substrate was taken out and washed with toluene and methanol.

(Formation of a Hydrophilic/Hydrophobic Pattern)

The PET substrate having the initiator fixed on the surface thereof was given energy image-wise and then subjected to graft polymerization in the same manner as in Example 1, to form image-wise hydrophilic/hydrophobic pattern.

Then, the substrate having a hydrophilic/hydrophobic pattern formed thereon was set, as a printing plate, in a lithron printing machine supplied with wetting water IF201 (2.5%) and IF202 (0.75%) (Fuji Photo Film Co., Ltd.) and GEOS-G ink (Dainippon Ink and Chemicals, Incorporated), to conduct printing in a usual manner.

By observing whether an image region on the resulting print was formed well or not and whether a non-image region was stained or not, the print was found to have good qualities without missing portion in the image region or stain on the non-image region.

Thereafter, 10,000 sheets were successively printed, and even after the 10,000 sheets were printed, good prints could be obtained without thin spots in the image region or stain in the non-image region. Accordingly, it is confirmed that when the hydrophilic/hydrophobic pattern obtained by the image forming method of the invention was used as a planographic printing plate, the resulting prints were excellent in both image qualities and printing resistance.

Example 7

(Adsorption of Fine $TiO_2$ Particles onto Acrylic Acid Graft Polymer Pattern)

The substrate K, prepared in Example 1, was dipped for 1 hour in an aqueous dispersion of positively charged fine $TiO_2$ particles (1.5% by weight, C.I. Kasei Co., Ltd.), then removed, washed sufficiently with water and rubbed 30 times with a cloth (BEMCOT manufactured by Asahi Chemical Industry Co., Ltd.) by hand in water. Thereafter, the sample was dried to give fine particle adsorption pattern material of Example 7.

<Evaluation>

When the resulting fine particle adsorption pattern material was observed at ×50,000 magnification under a scanning electron microscope (JEOL S800), it was revealed that the pattern material had a pattern comprising lamination of fine $TiO_2$ particles. The fine particles hardly adhered to a region where the graft polymer was absent, thus showing a pattern excellent in discrimination. When the unevenness of the density was measured with a Macbeth densitometer, the density varied between 0.1 and 0.4. In this measurement, image areas of four squares each having sides of 5 cm were measured.

Further, this sample was washed again by rubbing 50 times with the cloth in water and observed under an electron microscope. It was revealed that the sample maintained the same vivid pattern as initial and the pattern was highly strong without changing its shape by rubbing.

The zeta potential of the fine $TiO_2$ particle, as determined by ZETASIZER 2000 (Malvern Instruments), was found to be +42 mV. Accordingly, it was confirmed that the fine $TiO_2$ particle had positive charge.

Example 8

A fine particle adsorption pattern material in Example 8 was obtained in the same manner as in Example 7 except that the fine particles adsorbed by the acrylic acid graft polymer pattern in Example 7 were changed to fine $Al_2O_3$ particles (C.I. Kasei Co., Ltd.).

The resulting fine particle adsorption pattern material showed a vivid pattern when observed under a scanning electron microscope in the same manner as in Example 7. The shape of the pattern was not changed even if the pattern was repeatedly rubbed in the same manner as in Example 7.

The zeta potential of the fine $Al_2O_3$ particle was found to be +77 mV. Accordingly, it was confirmed that the fine $Al_2O_3$ particle had positive charge.

As shown in Examples 7 and 8, it can be seen that a strong and uniform pattern of adsorbed fine particles which is not removed by mechanical operation such as rubbing can be formed on only a desired region on a substrate by easy operations.

Example 9

The substrate S, prepared in Example 2, was immersed in distilled water for one minute. As a result, water was adsorbed by portions on the substrate S other than the graft polymer pattern portions. Then, silica fine particles (having a particle diameter of 3 μm, manufactured by TOSOH SILICA CORPORATION) whose surfaces had been subjected to hydrophobicity-imparting treatment were applied to the substrate S with a rubber roller. As a result, a pattern of the silica fine particles, the silica particles adhering only to the hydrophobic graft polymer pattern portions in the pattern, was obtained.

Comparative Example 3

The substrate R, prepared in Comparative Example 1, was allowed to adsorb $TiO_2$ particles in the same manner as Example 7. The resultant fine particles adsorption pattern material was measured with an electron microscope, and it was found that $TiO_2$ adsorption pattern was formed on the substrate R. It was also confirmed that the $TiO_2$ particles were scarcely adhered to portions other than graft polymer regions and the pattern has excellent discrimination. However, when an area of 5 cm square was observed with the naked eye, it was found that the pattern was uneven. When the unevenness of the density was measured with a Macbeth densitometer, the density varied between 0.1 and 0.4. In this measurement, image areas of four squares each having sides of 5 cm were measured.

Example 10

(Preparation of Conductive Particle Dispersion)

3 g of bis(1,1-trimethylammoniumdecanoylaminoethyl)disulfide was added to 50 ml of 5 mM solution of silver perchlorate in ethanol, and then 30 ml of 0.4 M sodium boron hydride was added dropwise to the solution under vigorous stirring to reduce the ions, whereby a dispersion of silver particles coated with quaternary ammonium was obtained. The average particle diameter of the silver particles as determined under an electron microscope was 5 nm.

(Adsorption of Conductive Particles)

Then, the substrate K, prepared in Example 1, was dipped in the positively charged Ag particle dispersion obtained above, and thereafter the surface of the substrate was sufficiently washed with running water to remove an excess of the dispersion of fine particles, to produce a conductive pattern material 1 of Example 10.

<Evaluation>

1. Evaluation of Pattern Uniformity

The surface of the conductive pattern material 1 having the fine conductive particles adsorbed thereon was observed with AFM (NANOPIX 1000, Seiko Instruments Inc.). As a result, it was confirmed that a pattern having uniform thickness resulting from the adsorbed fine Ag particles was formed only on the hydrophilic acrylic acid graft polymer.

2. Evaluation of Conductive Stability

The electrical conductivity of the surface of the fine Ag particles in the pattern region, as determined with a four-probe method using LORESTA-FP (Mitsubishi Chemical Co., Ltd.), was $10\Omega/\square$. From this result, it was revealed that a conductive pattern excellent in electrical conductivity was formed.

3. Evaluation of Abrasion Resistance

The surface of the conductive pattern material 1 having fine conductive particles adsorbed thereon was rubbed 30 times with a water-moistened cloth (BEMCOT manufactured by Asahi Chemical Industry Co., Ltd.) by hand. After rubbing, the surface was observed at ×100,000 magnification with AFM (NANOPIX 1000, Seiko Instruments Inc.), and as a result, a dense pattern resulting from the adsorbed fine Ag particles, which was similar to the pattern before rubbing, was observed only on the region exposed to light. It was thus confirmed that the shape of the precise pattern on the surface was not deteriorated by rubbing.

Example 11

The substrate K, prepared in Example 1, was dipped in a solution obtained by dissolving 1.23 g of sodium anthraquinone-2-sulfonate $1H_2O$, 7.20 g of sodium 5-sulfosalicylate hydrate and 4.38 g of iron trichloride $6H_2O$ in 125 ml water and kept therein under stirring, while a solution obtained by mixing 0.75 ml of pyrrole and 125 ml of water was added thereto. After 1 hour, the substrate K was taken out, washed with water and washed with acetone, to give a conductive pattern material 2 of Example 11 having a polypyrrole layer formed on the surface of the substrate K.

<Evaluation>

The resulting conductive pattern material 2 was evaluated with respect to pattern uniformity, conductive stability and abrasion resistance by the same method as in Example 10.

For evaluation of pattern uniformity, the surface of the conductive pattern material 2 having a conductive polymer adsorbed thereon was observed with AFM (NANOPIX 1000, Seiko Instruments Inc.). As a result, it was confirmed that a pattern having uniform thickness was formed, which pattern was formed by the polypyrrole layer adsorbed only on the region where the hydrophilic acrylic acid graft polymer was formed.

In evaluation of conductive stability, the electrical conductivity of the surface of the conductive polymer layer was $950\Omega/\square$, which indicated the formation of a conductive pattern having an excellent electrical conductivity.

In evaluation of abrasion resistance, a resin film supposedly formed by the conductive polymer was observed only on the region which had been exposed to light even after rubbing, and peeling of the resin film was not observed. It was thus confirmed that the polymer layer was not deteriorated by rubbing.

Example 12

A polyacrylic acid pattern substrate B was prepared in the same manner as in Example 1, except that a quarz mask (FUJI No. 1, manufactured by SK Electronics Co., Ltd, a lattice pattern with grid width of 10 μm and grid interval of 200 μm) was used in place of the quartz mask used in Example 1, which was manufactured by SK Electronics Co., Ltd. and had a lattice pattern with rid width of 25 μm and grid interval of 100 μm. A conductive pattern material 3 was prepared in the same manner as in Example 11, except that the polyacrylic acid pattern substrate B was used in place of the substrate K. The surface resistivity of the conductive pattern material 3 was measured in the same manner as in Example 10, and it was found that the surface resistivity was $1,500\Omega/\square$. Other portions on the conductive pattern material 3 were further measured, and the surface resistivity values were respectively $1,600\Omega/\square$, $1,700\Omega/\square$, and $1,400\Omega/\square$. Accordingly, the conductive pattern material 3 had good uniformity of surface resistivity.

Example 13

The substrate S, prepared in Example 2, was immersed in distilled water for one minute. As a result, water was adsorbed by portions on the substrate S other than the graft polymer pattern portions. Then, hydrophobic ink (NANOPASTE NPS-J, manufactured by Harima Chemicals, Inc.) containing silver fine particles dispersed therein was applied to the substrate S with a rubber roller. As a result, the silver ink adhered only to the hydrophobic graft polymer pattern portions, and a sharp silver pattern was obtained. The substrate having the silver pattern thereon was heated and kept at 230° C. for 30 minutes. The surface resistivity of the substrate was measured in the same manner as in Example 10, and it was found that the surface resistivity was $0.3\Omega/\square$, that is, the surface resistivity was excellent. When surface resistivity was measured in several areas of 10 cm squares, all the surface resistivity values were within the range of $0.2\Omega/\square$ to $0.4\Omega/\square$.

Comparative Example 4

A conductive pattern material 4 was prepared in the same manner as in Example 11, except that the substrate R, which was prepared in Comparative example 1, was used in place of the substrate K. When the uniformity of the obtained polypyrrole pattern was evaluated in the same manner as in Example 11, it was found that the pattern was uneven.

Comparative Example 5

A conductive pattern material 5 was prepared in the same manner as in Example 12, except that the substrate R, which was prepared in Comparative example 1, was used in place of the substrate K. The surface resistivity of the conductive material 5 was measured in the same manner as in Example 12, and it was found that the surface resistivity values in respective portions on the conductive pattern material 5 were respectively $500\Omega/\square$, $1,600\Omega/\square$, $3,000\Omega/\square$, and $1,400\Omega/\square$. Accordingly, it was confirmed that the surface resistivity of the conductive pattern material 5 varied greatly.

As described above, it was confirmed that the conductive pattern material formed by the method of the invention achieved excellent conductive stability, uniform thickness of the pattern film, and abrasion resistance, regardless of whether the fine conductive particles or the conductive polymer was used as a conductive material.

The pattern forming method of the invention can, upon application of energy, easily give a pattern having uniform quality, sharpness, and function according to a substance adhered to the pattern.

The image forming method in the invention can provide an image excellent in durability and sharpness by application of energy regardless of the area of the image forming material, and can thus be expected to be applied for various uses such as a display material for a highly dense image, or a planographic printing plate utilizing high hydrophilicity.

According to the fine particle adsorption pattern forming method in the invention, there can be provided a fine particle adsorption pattern forming method, which is capable of easily forming, on only a desired region of a substrate, a strong and uniform pattern of adsorbed fine particles not releasable by mechanical operation such as rubbing and which is applicable to formation of a large pattern. A fine particle adsorption pattern material produced by using the same is also provided.

According to the conductive pattern forming method in the invention, there can be provided a conductive pattern forming method capable of easily forming fine wires (circuit) excellent in durability and conductive stability, free of breaking and having uniform thickness. A conductive pattern material produced by using the same is also provided.

What is claimed is:

1. A pattern forming method, comprising image-wise forming, on a surface of a substrate, a region where an initiator having an ability to initiate polymerization is image-wise fixed over the whole area of the substrate and then image-wise exposing to light to inactivate the polymerization-initiating ability of the initiator in the region exposed to light so that the initiator fixed on the region not exposed to light maintains its activity, forming a graft polymer on the region by atom transfer radical polymerization to form a hydrophilic/hydrophobic pattern which includes regions having a graft polymer formed and regions having no graft polymer formed, and applying a substance to the hydrophilic or hydrophobic region of the hydrophilic/hydrophobic pattern, wherein the atom transfer radical polymerization is conducted in the presence of a transition metal complex as a catalyst.

2. A pattern forming method according to claim 1, wherein the region where an initiator having an ability to initiate polymerization is image-wise fixed is formed by fixing a polymerization initiator thereon and the graft polymer contains a monomer having hydrophilicity/hydrophobicity opposite to the hydrophilicity/hydrophobicity of the polymerization initiator.

3. A pattern forming method according to claim 1, wherein the substance is a colorant.

4. A pattern forming method according to claim 3, wherein the graft polymer contains a monomer having hydrophilicity/hydrophobicity opposite to the hydrophilicity/hydrophobicity of the polymerization initiator.

5. A pattern forming method according to claim 3, wherein the colorant is a dye.

6. A pattern forming method according to claim 5, wherein the dye has a charge opposite to a charge of the graft polymer.

7. A pattern forming method according to claim 1, wherein the substance is fine particles.

8. A pattern forming method according to claim 7, wherein the graft polymer has a polar group.

9. A pattern forming method according to claim 7, wherein the fine particles each have a charge opposite to a charge of the graft polymer.

10. A pattern forming method according to claim 1, wherein the substance is a conductive material.

11. A pattern forming method according to claim 10, wherein the graft polymer has a polar group.

12. A pattern forming method according to claim 10, wherein the conductive material is fine conductive particles each having a charge opposite to that of the graft polymer.

13. A pattern forming method according to claim 10, wherein the conductive material is a conductive polymer comprising a conductive monomer which can be adsorbed by a functional group of the graft polymer through ionic force.

* * * * *